(12) United States Patent
Shirakawa et al.

(10) Patent No.: US 8,350,445 B1
(45) Date of Patent: Jan. 8, 2013

(54) BULK ACOUSTIC RESONATOR COMPRISING NON-PIEZOELECTRIC LAYER AND BRIDGE

(75) Inventors: Alexandre Shirakawa, San Jose, CA (US); Dariusz Burak, Fort Collins, CO (US); Phil Nikkel, Loveland, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/168,101

(22) Filed: Jun. 24, 2011

Related U.S. Application Data

(63) Continuation-in-part of application No. 13/161,946, filed on Jun. 16, 2011.

(51) Int. Cl.
 *H03H 9/25* (2006.01)
(52) U.S. Cl. .................. 310/320; 310/365; 333/187
(58) Field of Classification Search .............. 310/320, 310/365; 333/187
 See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al, |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,344,004 A | 8/1982 | Okubo |
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |
| 4,625,138 A | 11/1986 | Ballato |
| 4,640,756 A | 2/1987 | Wang et al. |
| 4,719,383 A | 1/1988 | Wang et al. |
| 4,769,272 A | 9/1988 | Byrne et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | McClanahan et al. |

(Continued)

FOREIGN PATENT DOCUMENTS
DE  10160617  6/2003
(Continued)

OTHER PUBLICATIONS
U.S. Appl. No. 10/971,169, filed Oct. 22, 2004, Larson III, John D., et al.

(Continued)

*Primary Examiner* — Thomas Dougherty

(57) ABSTRACT

A bulk acoustic wave (BAW) resonator, comprises: a first electrode formed on a substrate; a piezoelectric layer formed on the first electrode; a second electrode formed on the first piezoelectric layer; a non-piezoelectric layer formed on the first electrode and adjacent to the piezoelectric layer; and a bridge formed between the non-piezoelectric layer and the first or second electrode.

11 Claims, 10 Drawing Sheets

U.S. PATENT DOCUMENTS

| | | |
|---|---|---|
| 4,906,840 A | 3/1990 | Zdeblick et al. |
| 4,975,892 A * | 12/1990 | Defranould et al. .......... 367/140 |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,166,646 A | 11/1992 | Avanic et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Boloforosh |
| 5,475,351 A | 12/1995 | Uematsu et al. |
| 5,548,189 A | 8/1996 | Williams |
| 5,567,334 A | 10/1996 | Baker et al. |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,704,037 A | 12/1997 | Chen |
| 5,705,877 A | 1/1998 | Shimada |
| 5,714,917 A | 2/1998 | Elia |
| 5,729,008 A | 3/1998 | Blalock et al. |
| 5,789,845 A | 8/1998 | Wadaka et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita et al. |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,051,907 A | 4/2000 | Ylilammi |
| 6,060,818 A | 5/2000 | Ruby et al. |
| 6,087,198 A | 7/2000 | Panasik |
| 6,090,687 A | 7/2000 | Merchant et al. |
| 6,107,721 A | 8/2000 | Lakin |
| 6,111,341 A | 8/2000 | Hirama |
| 6,111,480 A | 8/2000 | Iyama et al. |
| 6,114,795 A | 9/2000 | Tajima et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk |
| 6,150,703 A | 11/2000 | Cushman et al. |
| 6,187,513 B1 | 2/2001 | Katakura |
| 6,198,208 B1 | 3/2001 | Yano et al. |
| 6,215,375 B1 | 4/2001 | Larson, III et al. |
| 6,219,032 B1 | 4/2001 | Rosenberg et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,284,121 B1 | 9/2001 | Reid |
| 6,292,336 B1 | 9/2001 | Horng et al. |
| 6,306,755 B1 | 10/2001 | Zheng |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella et al. |
| 6,498,604 B1 | 12/2002 | Jensen |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |
| 6,559,530 B2 | 5/2003 | Hinzel et al. |
| 6,564,448 B1 | 5/2003 | Oura et al. |
| 6,566,956 B2 | 5/2003 | Ohnishi et al. |
| 6,566,979 B2 | 5/2003 | Larson, III et al. |
| 6,580,159 B1 | 6/2003 | Fusaro et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,603,182 B1 | 8/2003 | Low et al. |
| 6,617,249 B2 | 9/2003 | Ruby et al. |
| 6,617,750 B2 | 9/2003 | Dummermuth et al. |
| 6,617,751 B2 | 9/2003 | Sunwoo et al. |
| 6,621,137 B1 | 9/2003 | Ma et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson, III et al. |
| 6,657,363 B1 | 12/2003 | Aigner |
| 6,668,618 B2 | 12/2003 | Larson, III et al. |
| 6,670,866 B2 | 12/2003 | Ella et al. |
| 6,677,929 B2 | 1/2004 | Gordon et al. |

| | | | |
|---|---|---|---|
| 6,693,500 B2 | 2/2004 | Yang et al. |
| 6,710,508 B2 | 3/2004 | Ruby et al. |
| 6,710,681 B2 | 3/2004 | Figueredo et al. |
| 6,713,314 B2 | 3/2004 | Wong et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Piazza et al. |
| 6,738,267 B1 | 5/2004 | Navas Sabater et al. |
| 6,750,593 B2 | 6/2004 | Iwata |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,820,469 B1 | 11/2004 | Adkins et al. |
| 6,828,713 B2 | 12/2004 | Bradley et al. |
| 6,842,088 B2 | 1/2005 | Yamada et al. |
| 6,842,089 B2 | 1/2005 | Lee |
| 6,849,475 B2 | 2/2005 | Kim |
| 6,853,534 B2 | 2/2005 | Williams |
| 6,861,920 B2 | 3/2005 | Ishikawa et al. |
| 6,872,931 B2 | 3/2005 | Liess et al. |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,837 B2 | 8/2005 | Yamada et al. |
| 6,936,928 B2 | 8/2005 | Hedler et al. |
| 6,936,954 B2 | 8/2005 | Peczalski |
| 7,758,979 B2 | 8/2005 | Yamada et al. |
| 6,941,036 B2 | 9/2005 | Lucero |
| 6,943,647 B2 | 9/2005 | Aigner |
| 6,943,648 B2 | 9/2005 | Maiz et al. |
| 6,946,928 B2 | 9/2005 | Larson, III et al. |
| 6,954,121 B2 | 10/2005 | Bradley et al. |
| 6,963,257 B2 | 11/2005 | Ella et al. |
| 6,970,365 B2 | 11/2005 | Turchi |
| 6,975,183 B2 | 12/2005 | Aigner et al. |
| 6,977,563 B2 | 12/2005 | Komuro et al. |
| 6,985,051 B2 | 1/2006 | Nguyen et al. |
| 6,985,052 B2 | 1/2006 | Tikka |
| 6,987,433 B2 | 1/2006 | Larson, III et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson, III |
| 7,026,876 B1 | 4/2006 | Esfandiari et al. |
| 7,053,456 B2 | 5/2006 | Matsuo |
| 7,057,476 B2 | 6/2006 | Hwu |
| 7,057,478 B2 | 6/2006 | Korden et al. |
| 7,064,606 B2 | 6/2006 | Louis |
| 7,084,553 B2 | 8/2006 | Ludwiczak |
| 7,091,649 B2 | 8/2006 | Larson, III et al. |
| 7,098,758 B2 | 8/2006 | Wang et al. |
| 7,102,460 B2 | 9/2006 | Schmidhammer et al. |
| 7,109,826 B2 | 9/2006 | Ginsburg et al. |
| 7,128,941 B2 | 10/2006 | Lee |
| 7,129,806 B2 | 10/2006 | Sato |
| 7,138,889 B2 | 11/2006 | Lakin |
| 7,161,448 B2 | 1/2007 | Feng et al. |
| 7,170,215 B2 | 1/2007 | Namba et al. |
| 7,173,504 B2 | 2/2007 | Larson, III et al. |
| 7,179,392 B2 * | 2/2007 | Robert et al. .................. 216/2 |
| 7,187,254 B2 | 3/2007 | Su et al. |
| 7,209,374 B2 | 4/2007 | Noro |
| 7,212,083 B2 | 5/2007 | Inoue et al. |
| 7,212,085 B2 | 5/2007 | Wu |
| 7,230,509 B2 | 6/2007 | Stoemmer |
| 7,230,511 B2 | 6/2007 | Onishi et al. |
| 7,233,218 B2 | 6/2007 | Park et al. |
| 7,242,270 B2 | 7/2007 | Larson, III et al. |
| 7,259,498 B2 | 8/2007 | Nakatsuka et al. |
| 7,268,647 B2 | 9/2007 | Sano et al. |
| 7,275,292 B2 | 10/2007 | Ruby et al. |
| 7,276,994 B2 | 10/2007 | Takeuchi et al. |
| 7,280,007 B2 | 10/2007 | Feng |
| 7,281,304 B2 | 10/2007 | Kim et al. |
| 7,294,919 B2 | 11/2007 | Bai |
| 7,301,258 B2 | 11/2007 | Tanaka |
| 7,310,861 B2 | 12/2007 | Aigner et al. |
| 7,313,255 B2 | 12/2007 | Machida et al. |
| 7,332,985 B2 | 2/2008 | Larson, III et al. |
| 7,345,410 B2 | 3/2008 | Grannen et al. |
| 7,358,831 B2 | 4/2008 | Larson et al. |
| 7,367,095 B2 | 5/2008 | Larson, III et al. |
| 7,368,857 B2 | 5/2008 | Tanaka |
| 7,369,013 B2 | 5/2008 | Fazzio et al. |
| 7,385,467 B2 | 6/2008 | Stoemmer et al. |
| 7,388,318 B2 | 6/2008 | Yamada et al. |
| 7,388,454 B2 | 6/2008 | Ruby et al. |
| 7,388,455 B2 | 6/2008 | Larson, III |
| 7,391,286 B2 | 6/2008 | Jamneala et al. |
| 7,400,217 B2 | 7/2008 | Larson, III et al. |
| 7,408,428 B2 | 8/2008 | Larson, III |
| 7,414,349 B2 | 8/2008 | Sasaki |
| 7,414,495 B2 | 8/2008 | Iwasaki et al. |
| 7,420,320 B2 | 9/2008 | Sano et al. |
| 7,423,503 B2 | 9/2008 | Larson, III et al. |
| 7,425,787 B2 | 9/2008 | Larson, III |
| 7,439,824 B2 | 10/2008 | Aigner et al. |
| 7,463,118 B2 | 12/2008 | Jacobsen |
| 7,466,213 B2 | 12/2008 | Lobl et al. |
| 7,482,737 B2 | 1/2009 | Yamada et al. |
| 7,508,286 B2 | 3/2009 | Ruby et al. |
| 7,515,018 B2 | 4/2009 | Handtmann et al. |
| 7,535,324 B2 | 5/2009 | Fattinger et al. |
| 7,545,532 B2 | 6/2009 | Muramoto |
| 7,561,009 B2 | 7/2009 | Larson, III et al. |
| 7,576,471 B1 | 8/2009 | Solal |
| 7,602,101 B2 | 10/2009 | Hara et al. |
| 7,619,493 B2 | 11/2009 | Uno et al. |
| 7,629,865 B2 | 12/2009 | Ruby |
| 7,655,963 B2 | 2/2010 | Sadaka et al. |
| 7,684,109 B2 | 3/2010 | Godshalk et al. |
| 7,768,364 B2 | 8/2010 | Hart et al. |
| 7,791,434 B2 | 9/2010 | Fazzio et al. |
| 7,795,781 B2 | 9/2010 | Barber et al. |
| 7,869,187 B2 | 1/2011 | McKinzie et al. |
| 7,889,024 B2 | 2/2011 | Bradley et al. |
| 7,978,025 B2 | 7/2011 | Yokoama et al. |
| 2001/0045793 A1 * | 11/2001 | Misu et al. ...................... 310/364 |
| 2002/0000646 A1 | 1/2002 | Gooch et al. |
| 2002/0030424 A1 | 3/2002 | Iwata |
| 2002/0063497 A1 | 5/2002 | Panasik |
| 2002/0070463 A1 | 6/2002 | Chang et al. |
| 2002/0121944 A1 | 9/2002 | Larson, III et al. |
| 2002/0121945 A1 | 9/2002 | Ruby et al. |
| 2002/0126517 A1 | 9/2002 | Matsukawa et al. |
| 2002/0140520 A1 | 10/2002 | Hikita et al. |
| 2002/0152803 A1 | 10/2002 | Larson, III et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0011285 A1 | 1/2003 | Ossmann |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |
| 2003/0179053 A1 | 9/2003 | Aigner et al. |
| 2003/0205948 A1 | 11/2003 | Lin et al. |
| 2004/0016995 A1 | 1/2004 | Kuo et al. |

| | | |
|---|---|---|
| 2004/0017130 A1 | 1/2004 | Wang et al. |
| 2004/0027216 A1 | 2/2004 | Ma et al. |
| 2004/0056735 A1 | 3/2004 | Nomura et al. |
| 2004/0092234 A1 | 5/2004 | Pohjonen |
| 2004/0099898 A1 | 5/2004 | Grivna et al. |
| 2004/0124952 A1 | 7/2004 | Tikka |
| 2004/0129079 A1 | 7/2004 | Kato et al. |
| 2004/0150293 A1 | 8/2004 | Unterberger |
| 2004/0150296 A1 | 8/2004 | Park et al. |
| 2004/0166603 A1 | 8/2004 | Carley |
| 2004/0195937 A1 | 10/2004 | Matsubara et al. |
| 2004/0212458 A1 | 10/2004 | Lee |
| 2004/0246075 A1 | 12/2004 | Bradley et al. |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0012716 A1 | 1/2005 | Mikulin et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0093396 A1 | 5/2005 | Larson, III et al. |
| 2005/0093653 A1 | 5/2005 | Larson, III |
| 2005/0093654 A1 | 5/2005 | Larson, III et al. |
| 2005/0093655 A1 | 5/2005 | Larson, III et al. |
| 2005/0093657 A1 | 5/2005 | Larson, III et al. |
| 2005/0093658 A1 | 5/2005 | Larson, III et al. |
| 2005/0093659 A1 | 5/2005 | Larson, III et al. |
| 2005/0104690 A1 | 5/2005 | Larson, III et al. |
| 2005/0110598 A1 | 5/2005 | Larson, III |
| 2005/0128030 A1 | 6/2005 | Larson, III et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206479 A1 | 9/2005 | Nguyen et al. |
| 2005/0206483 A1 | 9/2005 | Pashby et al. |
| 2005/0218488 A1 | 10/2005 | Matsuo |
| 2005/0248232 A1 | 11/2005 | Itaya et al. |
| 2005/0269904 A1 | 12/2005 | Oka |
| 2005/0275486 A1 | 12/2005 | Feng |
| 2006/0017352 A1 | 1/2006 | Tanielian |
| 2006/0071736 A1 | 4/2006 | Ruby et al. |
| 2006/0081048 A1 | 4/2006 | Mikado et al. |
| 2006/0087199 A1 | 4/2006 | Larson, III et al. |
| 2006/0103492 A1 | 5/2006 | Feng et al. |
| 2006/0114541 A1 | 6/2006 | Van Beek |
| 2006/0119453 A1 | 6/2006 | Fattinger et al. |
| 2006/0125489 A1 | 6/2006 | Feucht et al. |
| 2006/0132262 A1 | 6/2006 | Fazzio et al. |
| 2006/0164183 A1 | 7/2006 | Tikka et al. |
| 2006/0164186 A1 | 7/2006 | Stoemer et al. |
| 2006/0176126 A1 | 8/2006 | Wang et al. |
| 2006/0185139 A1 | 8/2006 | Larson, III et al. |
| 2006/0197411 A1 | 9/2006 | Hoen et al. |
| 2006/0238070 A1 | 10/2006 | Costa et al. |
| 2006/0284706 A1 | 12/2006 | Ginsburg et al. |
| 2006/0284707 A1 | 12/2006 | Larson, III et al. |
| 2006/0290446 A1 | 12/2006 | Aigner et al. |
| 2007/0035364 A1 | 2/2007 | Sridhar et al. |
| 2007/0037311 A1 | 2/2007 | Izumi et al. |
| 2007/0080759 A1 | 4/2007 | Jamneala et al. |
| 2007/0085447 A1 | 4/2007 | Larson, III |
| 2007/0085631 A1 | 4/2007 | Larson, III et al. |
| 2007/0085632 A1 | 4/2007 | Larson et al. |
| 2007/0086080 A1 | 4/2007 | Larson, III et al. |
| 2007/0086274 A1 | 4/2007 | Nishimura et al. |
| 2007/0090892 A1 | 4/2007 | Larson, III |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2007/0279153 A1 | 12/2007 | Ruby |
| 2008/0055020 A1 | 3/2008 | Handtmann et al. |
| 2008/0143215 A1 | 6/2008 | Hara et al. |
| 2008/0297278 A1 | 12/2008 | Handtmann et al. |

| | | | |
|---|---|---|---|
| 2008/0297279 A1 | 12/2008 | Thalhammer et al. | |
| 2008/0297280 A1 | 12/2008 | Thalhammer et al. | |
| 2009/0064498 A1 | 3/2009 | Mok et al. | |
| 2009/0079302 A1 | 3/2009 | Wall et al. | |
| 2009/0096550 A1 | 4/2009 | Handtmann et al. | |
| 2009/0127978 A1 | 5/2009 | Asai et al. | |
| 2009/0153268 A1 | 6/2009 | Milson et al. | |
| 2010/0013573 A1 | 1/2010 | Umeda | |
| 2010/0052176 A1 | 3/2010 | Kamada et al. | |
| 2010/0052815 A1 | 3/2010 | Bradley et al. | |
| 2010/0091370 A1 | 4/2010 | Mahrt et al. | |
| 2010/0102358 A1 | 4/2010 | Lanzieri et al. | |
| 2010/0148637 A1 | 6/2010 | Satou | |
| 2010/0176899 A1 | 7/2010 | Schaufele et al. | |
| 2010/0187948 A1 | 7/2010 | Sinha et al. | |
| 2010/0187949 A1 | 7/2010 | Pahl et al. | |
| 2010/0260453 A1 | 10/2010 | Block | |
| 2010/0327697 A1 | 12/2010 | Choy et al. | |
| 2010/0327994 A1 | 12/2010 | Choy et al. | |
| 2011/0121689 A1 | 5/2011 | Grannen et al. | |
| 2011/0121916 A1 | 5/2011 | Barber et al. | |
| 2011/0180391 A1 | 7/2011 | Larson et al. | |
| 2011/0204997 A1 | 8/2011 | Elbrecht et al. | |
| 2012/0161902 A1* | 6/2012 | Feng et al. | 333/187 |
| 2012/0194297 A1* | 8/2012 | Choy et al. | 333/187 |

FOREIGN PATENT DOCUMENTS

| | | |
|---|---|---|
| DE | 10239317 | 3/2004 |
| EP | 231892 | 8/1987 |
| EP | 0637875 | 2/1995 |
| EP | 689254 | 12/1995 |
| EP | 0865157 | 9/1998 |
| EP | 880227 | 11/1998 |
| EP | 1047189 | 10/2000 |
| EP | 1096259 | 5/2001 |
| EP | 1100196 | 5/2001 |
| EP | 1180494 | 2/2002 |
| EP | 1249932 | 10/2002 |
| EP | 1258989 | 11/2002 |
| EP | 1258990 | 11/2002 |
| EP | 1517443 | 3/2005 |
| EP | 1517444 | 3/2005 |
| EP | 1528674 | 5/2005 |
| EP | 1528675 | 5/2005 |
| EP | 1528676 | 5/2005 |
| EP | 1528677 | 5/2005 |
| EP | 1542362 | 6/2005 |
| EP | 1557945 | 7/2005 |
| EP | 1575165 | 9/2005 |
| EP | 0973256 | 9/2006 |
| EP | 2299593 | 3/2011 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 59023612 | 2/1984 |
| JP | 61054686 | 3/1986 |
| JP | 6165507 | 4/1986 |
| JP | 62-109419 | 5/1987 |
| JP | 62-200813 | 9/1987 |
| JP | 1-295512 | 11/1989 |
| JP | 2-10907 | 1/1990 |
| JP | 06005944 | 1/1994 |
| JP | 8-330878 | 12/1996 |
| JP | 09-027729 | 1/1997 |
| JP | 9-83029 | 3/1997 |
| JP | 10-32456 | 2/1998 |
| JP | 2000-31552 | 1/2000 |
| JP | 2000-0076295 | 3/2000 |
| JP | 2000-232334 | 8/2000 |
| JP | 2000-295065 | 10/2000 |
| JP | 2000-332568 | 11/2000 |
| JP | 2001-102901 | 4/2001 |
| JP | 2001-508630 | 6/2001 |
| JP | 2002217676 | 8/2002 |
| JP | 2003/017964 | 1/2003 |
| JP | 2003-17974 | 1/2003 |
| JP | 2003017964 | 1/2003 |

| | | |
|---|---|---|
| JP | 2003-505905 | 2/2003 |
| JP | 2003-505906 | 2/2003 |
| JP | 2003/124779 | 4/2003 |
| JP | 2003124779 | 4/2003 |
| JP | 2003-332872 | 11/2003 |
| JP | 2006-109472 | 4/2006 |
| JP | 2006-295924 | 10/2006 |
| JP | 2006-319796 | 11/2006 |
| JP | 2007-006501 | 1/2007 |
| JP | 2007/028669 | 2/2007 |
| JP | 2007-295306 | 11/2007 |
| WO | WO-98/16957 | 4/1998 |
| WO | WO-98/38736 | 9/1998 |
| WO | WO-98/56049 | 12/1998 |
| WO | WO-99/37023 | 7/1999 |
| WO | WO-01/06646 | 1/2001 |
| WO | WO-01/06647 | 1/2001 |
| WO | WO-0199276 | 12/2001 |
| WO | WO-02/103900 | 12/2002 |
| WO | WO-03/030358 | 4/2003 |
| WO | WO-03/043188 | 5/2003 |
| WO | WO-03/050950 | 6/2003 |
| WO | WO-03/058809 | 7/2003 |
| WO | WO-2004/034579 | 4/2004 |
| WO | WO-2004/051744 | 6/2004 |
| WO | WO-2004/102688 | 11/2004 |
| WO | WO-2005/043752 | 5/2005 |
| WO | WO-2005/043753 | 5/2005 |
| WO | WO-2005/043756 | 5/2005 |
| WO | WO-2006/018788 | 2/2006 |

OTHER PUBLICATIONS

"Co-pending U.S. Appl. No. 13/161,946, filed Jun. 16, 2011".
Akiyama, et al., "Enhancement of Piezoelectric Response in Scandium Aluminum Nitride Alloy Thin Films Prepared by Dual Reactive Cosputtering", *Adv. Mater* 2009, 593-596.
Al-Ahmad, M. et al., "Piezoelectric-Based Tunable Microstrip Shunt Resonator", *Proceedings of Asia-Pacific Microwave Conference* 2006.
Aoyama, Takayuki et al., "Diffusion of Boron, Phosphorous, Arsenic and Antimony in Thermally Grown SiliconDioxide", *Journal of the Electrochemical Society*, vol. 146, No. 5 1999, 1879-1883.
Auld, B. A., "Acoustic Resonators", *Acoustic Fields and Waves in Solids, Second Edition*, vol. 11 1990, 250-259.
Bauer, L. O. et al., "Properties of Silicon Implanted with Boron Ions through Thermal Silicon Dioxide", *Solid State Electronics*, vol. 16, No. 3 Mar. 1973, 289-300.
Bi, F.Z., "Bulk Acoustic Wave RF Technology", *IEEE Microwave Magazine*, vol. 9, Issue 5. 2008, 65-80.
Chen, , "Fabrication and Characterization of ALN Thin Film Bulk Acoustic Wave Resonator", *Dissertation, University of Pittsburgh School of Engineering* 2006.
Choi, Sungjin et al., "Design of Half-Bridge Piezo-Transformer Converters in the AC Adapter Applications", *APEC 2005, IEEE* Mar. 2005, 244-248.
Coombs, Clyde F., "Electronic Instrument Handbook", *Second Edition, McGraw-Hill, Inc.* 1995, pp. 5.1 to 5.29.
C-S Lee, et al., "Copper-Airbridged Low-Noise GaAs PHEMT With Ti/WN$_x$/TI Diffusion Barrier for High-Frequency", *IEEE Transactions on Electron Devices*, vol. 53, Issue: 8. 2006, 1753-1758.
Denisse, C.M.M. et al., "Plasma-Enhanced Growth and Composition of Silicon Oxynitride Films", *J. Appl. Phys.*, vol. 60, No. 7. Oct. 1, 1986, 2536-2542.
Fattinger, G. G. et al., "Coupled Bulk Acoustic Wave Resonator Filters: Key technology for single-to-balanced RF filters", *0-7803-8331-1/4/W20.00; IEEE MTT-S Digest* 2004, 927-929.
Fattinger, G.G. et al., "Single-To-Balance Filters for Mobile Phones Using Coupled Resonator BAW Technology", *2004 IEEE Ultrasonics Symposium* Aug. 2004, 416-419.
Fattinger, G. B. et al., "Spurious Mode Suppression in Coupled Resonator Filters", *IEEE MTT-S International Microwave Symposium Digest* 2005, 409-412.
Gilbert, S. R., "An Ultra-Miniature, Low Cost Single Ended to Differential Filter for ISM Band Applications", *Micro, Symp. Digest, 2008 IEEE MTT-S* Jun. 2008, 839-842.

Grill, A. et al., "Ultralow-K Dielectrics Prepared by Plasma-Enhanced Chemical Vapor Deposition", *App. Phys. Lett*, vol. 79 2001, 803-805.
Hadimioglu, B. et al., ""Polymer Films As Acoustic Matching Layers".", *1990 IEEE Ultrasonics Symposium Proceedings*, vol. 3 PP. [Previously submitted as "Polymer Files As Acoustic Matching Layers, 1990 IEEE Ultrasonics Symposium Proceeding. vol. 4 pp. 1227-1340, Dec. 1990". Considered by Examiner on Mar. 20, 2007 Dec. 1990, 1337-1340.
Hara, K. , "Surface Treatment of Quartz Oscillator Plate by Ion Implantation", *Oyo Buturi*, vol. 47, No. 2 Feb. 1978, 145-146.
Holzlohner, Ronald et al., "Accurate Calculation of Eye Diagrams and Bit Error Rates in Optical Transmission Systems Using Linearization", *Journal of Lightwave Technology*, vol. 20, No. 3, Mar. 2002, pp. 389-400.
Ivensky, Gregory at al., "A Comparison of Piezoelectric Transformer AC/DC Converters with Current Doubler and voltage Doubler Rectifiers", *IEEE Transactions on Power Electronics*, vol. 19, No. 6. Nov. 2004.
Jamneala, T. et al., "Coupled Resonator Filter with Single-Layer Acoustic Coupler", *IEEE Transaction on Ultrasonics, Ferroelectrics, and Frequency Control*, vol. 55 Oct. 2008, 2320-2326.
Jamneala, Tiberiu et al., "Ultra-Miniature Coupled Resonator Filter with Single-Layer Acoustic Coupler", *IEEE Transactions on Ultrasonics, Ferroelectrics, and Frequency Control*, vol. 56, No. 11. Nov. 2009, 2553-2558.
Jiang, Yimin et al., "A Novel Single-Phase Power Factor Correction Scheme", *IEEE* 1993, 287-292.
Jung, Jun-Phil et al., "Experimental and Theoretical Investigation on the Relationship Between AlN Properties and AlN-Based FBAR Characteristics", *2003 IEEE International Frequency Control Symposium and PDA Exhibition Jointly with the 17th European Frequency and Time Forum* Sep. 3, 2003, 779-784.
Kaitila, J. et al., "Measurement of Acoustical Parameters of Thin Films", *2006 IEEE Ultrasonics Symposium* Oct. 2006, 464-467.
Krishnaswamy, S.V. at al., "Film Bulk Acoustic Wave Resonator Technology", May 29, 1990, 529-536.
Lakin, K.M. , "Bulk Acoustic Wave Coupled Resonator Filters", *2002 IEEE Internatinal Frequency Control Symposium and PDA Exhibition* May 2000, 8-14.
Lakin, K.M. , "Coupled Resonator Filters", *2002 IEEE Ultrasonics Symposium* May 2, 2002, 901-908.
Lakin, K.M. et al., "High Performance Stacked Crystal Filters for GPS and Wide Bandwidth Applications", *2001 IEEE Ultrasonics Symposium* Jan. 1, 2001, 833-838.
Lakin, K. M. et al., "Temperature Compensated Bulk Acoustic Thin Film Resonators", *IEEE Ultrasonics Symposium*, San Juan, Puerto Rico Oct. 2000, 855-858.
Lakin, K.M. , "Thin Film BAW Filters for Wide Bandwidth and High Performance Applications", *IEEE Microwave Symposium Digest*; vol. 2 Jun. 6-11, 2004, 923-926.
Lakin, K. M. , "Thin Film Resonators and Filters", *IEEE Untrasonics Symposium*, Caesar's Tahoe, NV Oct. 1999, 895-906.
Lakin, et al., "Wide Bandwidth Thin Film BAW Filters", *2004 IEEE Ultrasonics Symposium*, vol. 1, Aug. 2004, 407-410.
Larson III, John D. et al., "Measurement of Effective Kt2,Q,Rp,Rs vs. Temperature for Mo/AIN FBAR Resonators", *IEEE Ultrasonics Symposium* 2002, 939-943.
Lee, Jiunn-Homg et al., "Optimization of Frame-Like Film Bulk Acoustic Resonators for Suppression of Spurious Lateral Modes Using Finite Element Method", *IEEE Ultrasonic Symposium*, vol. 1, 2004, 278-281.
Li, Yunxiu et al., "AC-DC Converter with Worldwide Range Input Voltage by Series and Parallel Piezoelectric Transformer Connection", *35th Annual IEEE Power Electronics Specialists Conference* 2004.
Lobl, H.P. et al., "Piezoelectric Materials for BAW Resonators and Filters", *2001 IEEE Ultrasonics Symposium* Jan. 1, 2001, 807-811.
Loboda, M. J. , "New Solutions for Intermetal Dielectrics Using Trimethylsilane-Based PECVD Processes", *Microelectronics Eng.*, vol. 50. 2000, 15-23.

Martin, Steven J. et al., "Development of a Low Dielectric Constant Polymer for the Fabrication of Integrated Circuit Interconnect", *12 Advanced Materials* Dec. 23, 2000, 1769-1778.

Martin, et al., "Re-growth of C-Axis Oriented AlN Thin Films", *IEEE Ultrasonics Symposium* 2006, 169-172.

Martin, et al., "Shear Mode Coupling and Tilted Gram Growth of AlN Thin Films in BAW Resonators", *IEEE Transactions on Ultrasonics, Ferroelectrics, and Frequency Control*, vol. 53, No. 7 Jul. 2006, 1339-1343.

Martinez, et al., "High confinement suspended micro-ring resonators in silicon-on-insulator", *Optics Express*, Vo. 14, No. 13 Jun. 26, 2006, 6259-6263.

Merriam-Webster, , "Collegiate Dictionary", *tenth edition* 2000, 2 pages.

Navas, J. et al., "Miniaturised Battery Charger using Piezoelectric Transformers", *IEEE* 2001, 492-496.

Ng, J, et al., "The Diffusion Ion-Implanted Boron in Silicon Dioxide", *AIP Conf. Proceedings*, No. 122 1984, 20-33.

Ohta, S. et al., "Temperature Characteristics of Solidly Mounted Piezoelectric Thin Film Resonators", *IEEE Ultrasonics Symposium*, Honolulu, HI Oct. 2003, 2011-2015.

Pandey, et al., "Anchor Loss Reduction in Resonant MEMS using MESA Structures", *Proceedings of the 2nd IEEE International Conference on Nano/Micro Engineered and Molecular Systems*, Bangkok, Thailand Jan. 16-19, 2007, 880-885.

Pang, W. et al., "High Q Single-Mode High-Tone Bulk Acoustic Resonator Integrated With Surface-Machined FBAR Filter", *Microwave Symposium Digest, IEEE MTT-S International* 2005, 413-416.

Parker, T. E. et al., "Temperature-Compensated Surface Acoustic-Wave Devices with SiO2 Film Overlays", *J. Appl. Physics*, vol. 50 1360-1369, Mar. 1979.

Reinhardt, Alexandre et al., "Design of Coupled Resonator Filters Using Admittance and Scattering Matrices", *2003 IEEE Ultrasonics Symposium* May 3, 2003, 1428-1431.

Ruby, R. C. , "MicroMachined Thin Film Bulk Acoustic Resonators", *IEEE International Frequency Control Symposium* 1994, 135-138.

Ruby, R. et al., "The Effect of Perimeter Geometry on FBAR Resonator Electrical Performance", *Microwave Symposium, Digest, 2005 IEEE MTT-S International* Jun. 12, 2005, 217-221.

Sanchez, A.M. et al., "Mixed Analytical and Numerical Design Method for Piezoelectric Transformers", *IEEE Xplore* 2003, 841-846.

Schoenholz, J.E. et al., "Plasma-Enhanced Deposition of Silicon Oxynitride Films", *Thin Solid Films* 1987, 285-291.

Schuessler, Hans H. , "Ceramic Filters and Resonators", *Reprinted from IEEE Trans. Sonics Ultrason.*, vol. SU-21 Oct. 1974, 257-268.

Shirakawa, A. A. et al., "Bulk Acoustic Wave Coupled Resonator Filters Synthesis Methodology", *2005 European Microwave Conference*, vol. 1 Oct. 2005.

Small, M. K. et al., "A De-Coupled Stacked Bulk Acoustic Resonator (DSBAR) Filter with 2 dB Bandwidth >4%", *2007 IEEE Ultrasonics Symposium* Oct. 2007, 604-607.

Spangenberg, B. et al., "Dependence of the Layer Resistance of Boron Implantation in Silicon and the Annealing Conditions", *Comptus Rendus de l'Academic Bulgare des Sciences*, vol. 33, No. 3 1980, 325-327.

Tas, et al., "Reducing Anchor Loss in Micromechanical Extensional Mode Resonators", *IEEE Transactions on Ultrasonics, Ferroelectrics and Frequency Control*, vol. 57, No. 2. Feb. 2010, 448-454.

Thomsen, C. et al., "Surface Generation and Detection of Phonons by Picosecond Light Pulses", *Phys. Rev. B*, vol. 34 1986, 4129.

Tiersten, H. F. et al., "An Analysis of Thickness-Extensional Trapped Energy Resonant Device Structures with Rectangular Electrodes in the Piezoelectric Thin Film on Silicon Configuration", *J. Appl. Phys.* 54 (10) Oct. 1983, 5893-5910.

Topich, J. A. et al., "Effects of Ion Implanted Fluorine in Silicon Dioxide", *Nuclear Instr. and Methods, Cecon Rec*, Cleveland, OH May 1978, 70-73.

Tsubbouchi, K. et al., "Zero Temperature coefficient Surface Acoustic Wave Devices using Epitaxial AlN Films", *IEEE Ultrasonic symposium*, San Diego, CA, 1082 1982, 240-245.

Vasic, D et al., "A New Method to Design Piezoelectric Transformer Used in MOSFET & IGBT Drive Circuits", *IEEE 34th Annual Power Electronics Specialists Conference*, 2003 vol. 1 Jun. 15-19, 2003, 307-312.

Vasic, D et al., "A New MOSFET & IGBT Gate Drive Insulated by a Piezoelectric Transformer", *IEEE 32 nd Annual Power Electronics Specialists Conference*, 2001 vol. 3 2001, 1479-1484.

Yanagitani, et al., "Giant Shear Mode Electromechanical Coupling Coefficient k15 in C-Axis Tilted ScAlN Films", *IEEE International Ultrasonics Symposium* 2010.

Yang, C.M. et al., "Highly C Axis Oriented AlN Film Using MOCVD For 5GHx Band FBAR Filter", *2003 IEEE Ultrasonics Symposium* Oct. 5, 2003, pp. 170-173.

Co-pending U.S. Appl. No. 13/074,094, filed Mar. 29, 2011.
Co-pending U.S. Appl. No. 13/036,489, filed Feb. 28, 2011.
Co-pending U.S. Appl. No. 13/074,262, filed Mar. 29, 2011.
U.S. Appl. No. 13/101,376, filed May 5, 2011.
U.S. Appl. No. 12/710,640, filed Feb. 23, 2010.

Pensala, et al. "Spurious resonance suppression in gigahertz-range ZnO thin-film bulk acoustic wave resonators by the boundary frame method: modeling and experiment," IEEE Transactions on Ultrasonics, Ferroelectrics, and Frequency Control, vol. 56, No. 8, Aug. 2009, p. 1731-1744.

Pensala, "Thin film bulk acoustic wave devices: performance optimization and modeling," http://www.vtt.fi/inf/pdf/publications/2011/P756.pdf.

* cited by examiner ic signals to mechanical signals or vibrations, and/or mechanical signals or vibrations to electrical signals. Acoustic transducers, in particular, convert electrical signals to acoustic waves and acoustic waves to electrical signals using inverse and direct piezoelectric effects. Acoustic transducers generally include acoustic resonators, such as thin film bulk acoustic resonators (FBARs), surface acoustic wave (SAW) resonators or bulk acoustic wave (BAW) resonators, and may be used in a wide variety of electronic applications, such as cellular telephones, personal digital assistants (PDAs), electronic gaming devices, laptop computers and other portable communications devices. For example, FBARs may be used for electrical filters and voltage transformers.

BULK ACOUSTIC RESONATOR COMPRISING NON-PIEZOELECTRIC LAYER AND BRIDGE

CROSS-REFERENCE TO RELATED APPLICATIONS

This application is a continuation-in-part application of commonly owned U.S. patent application Ser. No. 13/161,946 entitled "Bulk Acoustic Resonator Comprising Non-Piezoelectric Layer" filed on Jun. 16, 2011 to Dariusz Burak, et al. The present application claims priority under 35 U.S.C. §120 to U.S. patent application Ser. No. 13/161,946, the disclosure of which is hereby incorporated by reference in its entirety.

BACKGROUND

Transducers generally convert electrical signals to mechanical signals or vibrations, and/or mechanical signals or vibrations to electrical signals. Acoustic transducers, in particular, convert electrical signals to acoustic waves and acoustic waves to electrical signals using inverse and direct piezoelectric effects. Acoustic transducers generally include acoustic resonators, such as thin film bulk acoustic resonators (FBARs), surface acoustic wave (SAW) resonators or bulk acoustic wave (BAW) resonators, and may be used in a wide variety of electronic applications, such as cellular telephones, personal digital assistants (PDAs), electronic gaming devices, laptop computers and other portable communications devices. For example, FBARs may be used for electrical filters and voltage transformers.

An acoustic resonator can be formed by a layer of piezoelectric material between two conductive plates (electrodes), which can be formed on a thin membrane. Such a resonator can generate acoustic waves that propagate in lateral directions when stimulated by an applied time-varying electric field, as well as higher order harmonic mixing products. The laterally propagating modes and the higher order harmonic mixing products may have a deleterious impact on functionality.

What is needed, therefore, is a structure useful in mitigating acoustic losses at the boundaries of the BAW resonator to improve mode confinement in the region of overlap of the top electrode, the piezoelectric layer, and the bottom electrode of a BAW resonator (commonly referred to as the active region).

SUMMARY

In accordance with a representative embodiment, a bulk acoustic wave (BAW) resonator, comprises: a first electrode formed on a substrate; a piezoelectric layer formed on the first electrode; a second electrode formed on the first piezoelectric layer; a non-piezoelectric layer formed on the first electrode and adjacent to the piezoelectric layer; and a bridge formed between the non-piezoelectric layer and the first or second electrode.

In accordance with another representative embodiment, a method of forming a bulk acoustic wave (BAW) resonator is disclosed. The method comprises: forming an acoustic reflector in a substrate; forming a first electrode on the substrate over the acoustic reflector; forming a piezoelectric layer and an non-piezoelectric layer adjacent to each other on the first electrode; forming a second electrode over the piezoelectric layer and the non-piezoelectric layer; and forming a layer between the non-piezoelectric layer and the first or second electrode to define a region for a bridge.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
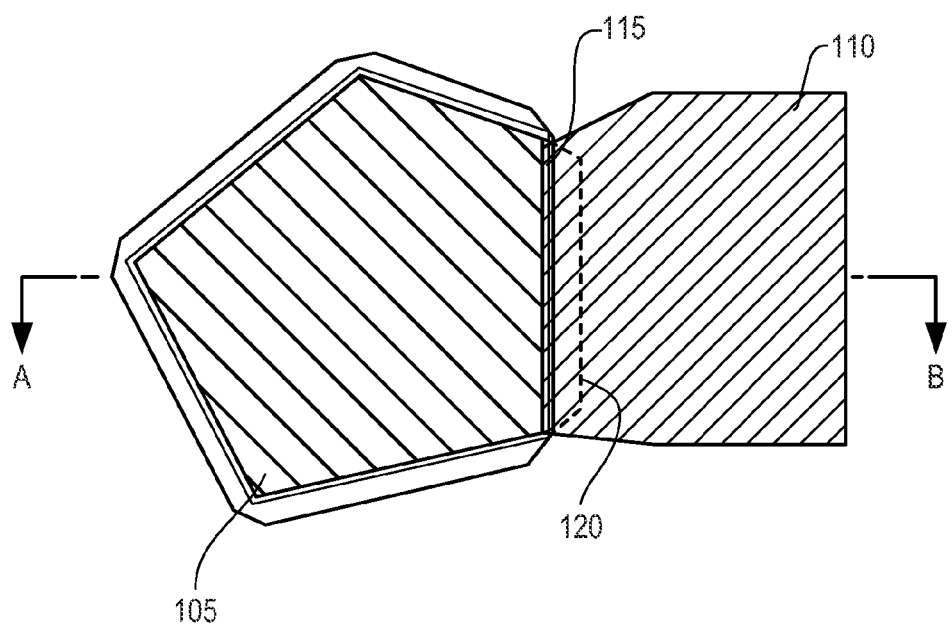
FIG. 1 is a top-view of an FBAR in accordance with a representative embodiment.

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

The present teachings relate generally to bulk acoustic wave (BAW) resonator structures such as FBARs. As will be described more fully below, the FBARs of the representative embodiments comprise a layer of piezoelectric material disposed between electrodes, a layer of non-piezoelectric (also referred to herein as "np") material disposed adjacent to the layer of piezoelectric material, and an air-bridge disposed between the layer of np material and one of the electrodes. The np material prevents piston-mode excitation at impedance discontinuity planes of the FBARs, which reduces radiative losses produced by scattering of the continuous spectrum of the piston-mode. The air-bridge, meanwhile, decouples propagating eigenmodes from an external region of the FBARs, which reduces radiative losses due to eigenmode scattering. Accordingly, the combination of the np material and the air-bridge reduces radiative losses that can be caused by different types of scattering.

In the layer of piezoelectric material, crystals are grown in columns that are perpendicular to the plane of the electrodes. As such, the c-axis orientations of the crystals are substantially aligned with one another and the layer of piezoelectric material may be referred to as a highly-textured c-axis piezoelectric layer. Such a layer of piezoelectric material can be fabricated according to one of a variety of known methods, such as those disclosed in U.S. Pat. No. 6,060,818, to Ruby, et al., the disclosure of which is hereby incorporated by reference. The layer of np layer is typically made from the same substance as the layer of piezoelectric material, but is either amorphous or polycrystalline and exhibits little or no piezoelectric effects because of crystal growth in a variety of directions. The layer of np material can be fabricated by methods described below or according to the teachings of U.S. Pat. No. 7,795,781 to Barber, et al., the disclosure of which is hereby incorporated by reference.

Acoustic resonators, and particularly FBARs, can be employed in a variety of configurations for RF and microwave devices such as filters and oscillators operating in a variety of frequency bands. For use in mobile communication devices, one particular example of a frequency band of interest is the 850 MHz "cellular band." In general, the size of a BAW resonator increases with decreasing frequency such that an FBAR for the 850 MHz band will be substantially larger than a similar FBAR for the 2 GHz personal communication services (PCS) band. In certain applications, the BAW resonator structures provide filters, such as ladder filters.

Certain details of FBARs and materials thereof and their methods of fabrication may be found, for example, in one or more of the following commonly owned U.S. Patents, Patent Application Publications and Patent Applications: U.S. Pat. No. 6,107,721, to Lakin; U.S. Pat. Nos. 5,587,620, 5,873,153, 6,507,983 and 7,629,865 to Ruby, et al.; U.S. Pat. No. 7,280,007 to Feng, et al.; U.S. Patent Application Publication No. 2007/0205850 to Jamneala, et al.; U.S. Pat. No. 7,388,454 to Richard C. Ruby, et al; U.S. Patent Application Publication No. 2010/0327697 to Choy, et al.; and U.S. Patent Application Publication No. 2010/0327994 to Choy, et al. Additional details may be found, for example, in U.S. Pat. No. 7,889,024 to Bradley et al.; U.S. patent application Ser. No. 13/074,094 of Shirakawa et al., and filed on Mar. 29, 2011, U.S. patent application Ser. No. 13/036,489 of Burak et al., and filed on Feb. 28, 2011, U.S. patent application Ser. No. 13/074,262 to Burak, et al. filed on Mar. 29, 2011, and U.S. patent application Ser. No. 13/101,376 of Burak et al., and filed on May 5, 2011.

The disclosures of these patents and patent applications are specifically incorporated herein by reference. It is emphasized that the components, materials and method of fabrication described in these patents and patent applications are representative and other methods of fabrication and materials within the purview of one of ordinary skill in the art are contemplated.

FIG. 1 shows a top view of an FBAR 100 in accordance with a representative embodiment. As illustrated by FIG. 1, FBAR 100 is formed in the shape of an apodized pentagon.

Referring to FIG. 1, FBAR 100 comprises a top electrode 105 and an interconnect 110. Top electrode 105 is formed illustratively with five sides, including a connection side 115 forming an electrical connection with interconnect 110. Interconnect 110 provides electrical signals to top electrode 105 to excite acoustic waves in piezoelectric layers of FBAR 100.

Top electrode 105 further comprises an air-bridge 120 disposed on multiple sides. As described more fully below, air-bridge 120 reduces propagating eigenmodes at the boundaries of FBAR 100, which can contribute to improved insertion loss and Q-factor over a desired frequency range, such as a passband of FBAR 100.

Figure 2:
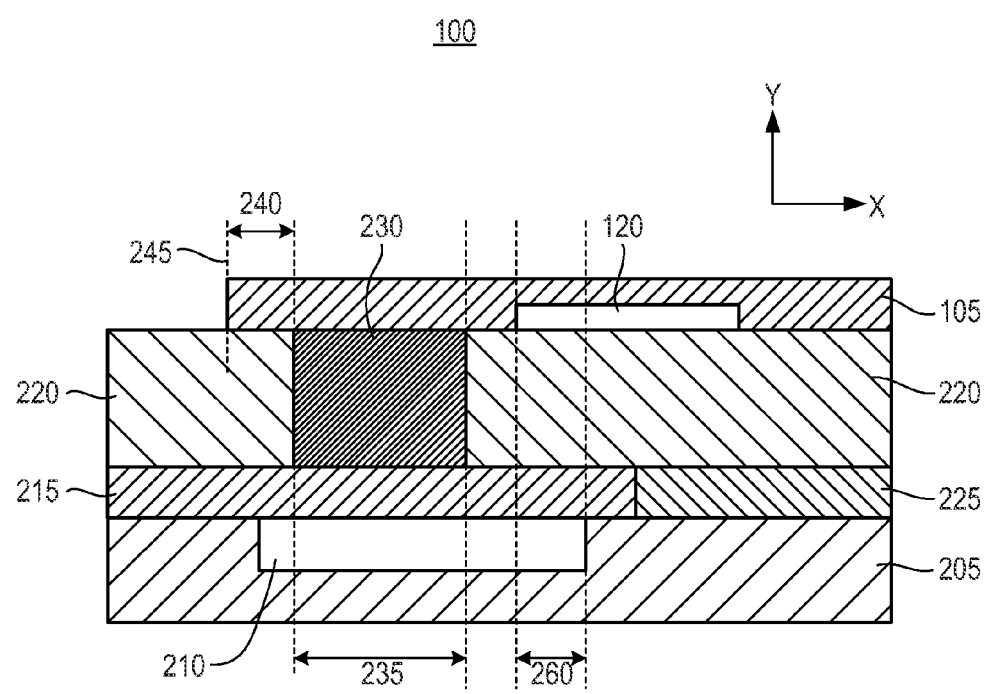
FIG. 2 is a cross-sectional view of the FBAR of FIG. 1, taken along a line A-B.

FIG. 2 is a cross-sectional view of FBAR 100 in accordance with a representative embodiment. The cross-sectional view of FIG. 2 is taken along a line A-B in FIG. 1.

Referring to FIG. 2, FBAR 100 comprises a substrate 205, a bottom electrode 215, a planarization layer 225, a piezoelectric layer 230, a non-piezoelectric (np) layer 220, and top electrode 105.

Substrate 205 contains a cavity 210 or other acoustic reflector, such as a distributed Bragg grating (DBR). Bottom electrode 215 is disposed over substrate 205 and suspended over cavity 210. Planarization layer 225 is formed over substrate 205, and it typically comprises non-etchable borosilicate glass (NEBSG). Planarization layer 225 can be omitted from FBAR 100 to reduce processing costs, but when present it tends to improve the quality of subsequently grown layers, such as a highly textured c-axis piezoelectric layer. In addition, planarization layer 225 can also simplify the processing of the subsequently grown layers.

Piezoelectric layer 230 is formed over bottom electrode 215, and it typically comprises highly-textured c-axis piezoelectric material such as aluminum nitride (AlN) or zinc oxide (ZnO). Np layer 220 is formed adjacent to piezoelectric layer 230 and is typically made from the same substance as piezoelectric layer 230 (e.g., AlN or ZnO). Unlike piezoelectric layer 130, np layer 220 is either amorphous or polycrystalline and exhibits little or no piezoelectric effects. Top electrode 105 is disposed over piezoelectric layer 230 and np layer 220.

Air-bridge 120 is formed between np layer 220 and top electrode 105. As described in further detail below, air-bridge 120 lowers a center of stress distribution of FBAR 100, which decouples propagating eigenmodes of FBAR 100 from an external region. This decoupling of the propagating eigenmodes prevents acoustic energy from leaking out of FBAR 100.

Typical dimensions of air-bridge 120 are approximately 2.0 μm to approximately 10.0 μm in width and approximately 300 Å to approximately 1500 Å in height. Air-bridge 120 extends over cavity 210 by an overlap 260. Overlap 260, also referred to as a decoupling region 260, has a typical width of about 0.0 μm (i.e., no overlap) to approximately 10.0 μm. The size of overlap 260 can affect the Q-factor and other properties of FBAR 100, and it can be determined experimentally to optimize these properties.

The width of air-bridge 120 can be adjusted according to various factors, such as energy tunneling, reliability, and chip size. In general, a wide bridge tends to minimize energy tunneling, which produces strong decoupling between eigenmodes inside on both sides of air-bridge 120. However, wide bridges can also reduce the reliability of FBAR 100 and increase its chip size. In general, the width of air-bridge 120 can be determined experimentally in order to improve the above factors in combination with other considerations, such as the Q-factor and electromechanical effective coupling coefficient $k_t^2$ of FBAR 100.

As indicated above, air-bridge 120 has a typical height of approximately 300 Å to approximately 1500 Å. The lower limit of the height is determined by limits on a process of removing a sacrificial layer during formation of air-bridge 120, and the upper limit of the height is determined in consideration of the potential quality of layers grown over air-bridge 120 and the quality of subsequent processing of possibly non-planar structures.

In some embodiments air-bridge 120 can be formed around an entire perimeter of FBAR 100. However, air-bridge 120 is not required to extend around the entire perimeter. For example, in the example of FIG. 1, air-bridge 120 is formed on only one side of FBAR 100.

Although FIG. 2 shows air-bridge 120 with a rectangular shape, the shape of air-bridge 120 can be modified in various ways. For example, it can be formed as a trapezoid as illustrated, for example, in FIGS. 6A through 6C. In addition, some embodiments also modify air-bridge 120 so that it contains a material rather than an air cavity. For instance, in certain embodiments, air-bridge 120 can be filled with NEBSG, CDO, SiC, or other suitable dielectric material that will not release when a sacrificial material in cavity 210 is released. In other embodiments, air-bridge 120 is filled with one of tungsten (W), molybdenum (Mo), aluminum (Al) or iridium (Ir), or other suitable metal that will not release when the sacrificial material disposed in cavity 210 is released.

An active region 235 is defined by an overlap of bottom electrode 215, piezoelectric layer 230, and top electrode 105. The use of np layer 220 in combination with air-bridge 120 reduces acoustic losses at the boundaries of FBAR 100 to improve mode confinement in active region 235.

The width of an overlap 240 between top electrode 105 and np layer 220 is selected to reduce acoustic losses resulting from scattering of both continuous modes and a lowest order propagating eigenmode in np layer 220 at an edge 245 of top electrode 105. As described more fully below, in certain embodiments the width of overlap 240 is selected to be greater than or equal to the inverse of the attenuation constant (1/k) (where k is the attenuation constant of the lowest order evanescent mode ($e^{-kx}$)) in the np layer 220 and closely approximates the behavior of continuous modes. Alternatively, the width of the overlap 240 is selected to be an integer multiple (1, 2, 3, . . . ) of quarter-wavelength (λ/4) of the lowest order propagating eigenmode in the np layer 108.

When the driving electrical signal has a frequency in a vicinity of a series resonance frequency ($F_s$) of FBAR 100, electrical energy is transferred to acoustic energy and vice-versa. While an electrical field (and thus electric energy density) is confined to the region defined by an overlap of top electrode 105 and bottom electrode 215, an acoustic field (and thus acoustic energy density) can be both confined to the region under the electrode (in the form of continuous modes), or it can propagate away (in the form of propagating eigenmodes). The electric field profile is determined by the lateral shape of top electrode 105, as bottom electrode 215 extends beyond top electrode 105 in an x-y plane in the depicted coordinate system.

Mathematically, the lateral shape of the electrical field in active region 235 can be represented as a Fourier superposition of plane waves propagating at different angles with respect to top or bottom interfaces of the piezoelectric layer 230 in FBAR 100. It should be emphasized that this is purely a mathematical concept, as there are no physical electric field waves propagating in the structure (other than associated with propagating acoustic waves). In other words, the spatial spectrum of the electric field is given by a Fourier transform on an electric field profile.

Each spatial spectral component of the electric field excites an acoustic plane wave propagating at the same angle with respect to top or bottom interfaces of piezoelectric layer 230. Unlike the electric field, which is confined vertically by the presence of bottom and top electrodes 215 and 105, the excited acoustic waves can propagate vertically through all the layers of FBAR 100. However, in general, electrically excited acoustic plane waves cannot propagate freely beyond active region 235 of FBAR 100 because of destructive interference of these acoustic plane waves upon the reflection from the interfaces.

The non-propagating waves in active region 235 form a set of continuous modes. The continuous modes decay exponentially in a direction away from an excitation region defined by an overlap of top electrode 105 and piezoelectric layer 230. However, for some spatial spectral components of the electric field, the excited acoustic waves interfere constructively upon reflections from the interfaces of the layer stack that comprise FBAR 100. These acoustic plane waves can propagate freely in the lateral direction (x-z plane) away from active region 235, and are referred to as propagating eigenmodes of FBAR 100. If these propagating eigenmodes are not confined to active region 235 or suppressed, deleterious loss of energy results. This loss of energy is manifested, for example, by a reduced Q-factor in FBAR 100.

The Fourier superposition of plane waves excited under top electrode 105 can be mathematically represented as a superposition of contributions from complex poles corresponding to propagating and evanescent eigenmodes for a given stack. The evanescent eigenmodes generally cannot propagate in the stack and decay exponentially from the point of excitation. Such a decomposition can be generally performed for any forced system, where forcing happens either through electrical excitation (like that under top electrode 105) or through mechanical excitation. The mechanical excitation occurs, for example, at an interface between two regions (e.g., an interface between piezoelectric layer 230 and np layer 220), where one region exhibits a known forcing motion, while the other region is passive and both regions are coupled through the continuity of stress and particle velocities at the interface between them.

In FBAR 100, motion in active region 235 is electrically excited, while motion in np layer 220 is mechanically excited and results from boundary conditions at the interface of the piezoelectric layer 230 and np layer 220. Piezoelectric layer 230 and np layer 220 are made of the same substance in order for these layers to be substantially elastically identical. Accordingly, their corresponding sets of propagating eigenmodes and evanescent eigenmodes will be also substantially identical. As a result, any propagating eigenmode excited in piezoelectric layer 230 within active region 235 will excite a corresponding propagating eigenmode of substantially equal amplitude in np layer 220. Similarly, any evanescent eigenmode excited by the electric field in piezoelectric layer 230 in active region 235 will excite a corresponding evanescent mode of substantially equal amplitude in np layer 220.

There is a significant difference in modal profiles between propagating and evanescent eigenmodes in the lateral direction (x-direction in FIG. 2). The modal profile is defined as a complex amplitude of particle displacement as a function of the lateral direction and a vertical direction (y-direction in FIG. 2). Propagating modes have a form of spatially periodic function, both in active region 235 and in np layer 220 outside of active region 235. By contrast, evanescent modes have a constant profile (i.e., the displacement amplitude does not depend on x-direction) in active region 235, and they decay exponentially in the direction away from the interface of piezoelectric layer 230 and np layer 220.

For typical electrical excitation, the lowest-order evanescent eigenmode contains a substantial portion (e.g., ~50%) of the elastic energy compared to energy confined in other higher-order evanescent eigenmodes and in the propagating eigenmodes. However, this partitioning of energy between the various eigenmodes depends on the frequency of excitation and the thicknesses and materials of layers in FBAR 100.

In certain illustrative embodiments, the width of overlap 240 is selected to be greater than or equal to the inverse of the attenuation constant (1/k) of the lowest order evanescent eigenmode in the np layer 220. As such, at an acoustic impedance discontinuity defined by an edge 245 of top electrode 105, the lowest order evanescent mode will have decayed sufficiently to prevent energy loss due to scattering at this interface.

Propagating eigenmodes of np layer 220 are mechanically excited at the interface of piezoelectric layer 230 and np layer 220 and they travel towards edge 245 of top electrode 105. Edge 245 presents a comparatively large acoustic impedance discontinuity for the propagating eigenmode, thus causing scattering and reflection of this eigenmode back to towards active region 235. This backward propagating eigenmode will interfere with the propagating mode excited at the interface of piezoelectric layer 230 and np layer 220. Depending on the phase upon the reflection and the width of overlap 240, the interference of the propagating eigenmode reflected at edge 245 with the propagating eigenmode excited at the interface of the piezoelectric layer 230 and the np layer 220 can be either constructive or destructive. It is beneficial to suppress the propagating mode amplitude in order to reduce the amount of energy that can possibly be lost to the propagating eigenmodes beyond edge 245. The existing modes beyond edge 245 include purely propagating shear and flexural modes, as well as a complex evanescent thickness extensional mode.

The propagating eigenmodes of np layer 220 also travel from the interface of piezoelectric layer 230 and np layer 220 toward air-bridge 120. Air-bridge 120 partially decouples these propagating eigenmodes from a region outside of FBAR 100, which can reduce the amount of acoustic energy lost due to these modes. This decoupling may happen due to the reflection of the propagating eigenmode from the edge of air-bridge 120, analogously to the reflection of the propagating eigenmode from the edge 245 of the top electrode 105 described above.

The above description is a single-excitation-point (e.g. at the interface between piezoelectric layer 230 and np layer 220) approximation to the complete case of the propagating eigenmode excitation problem, and is given to facilitate basic appreciation for the effects arising from the wave nature of the case considered here. As noted above, the propagating eigenmodes are continuously excited in the entire active region 235 and as such form a diffraction pattern in np layer 220. This diffraction pattern is further complicated by the presence of large acoustic impedance discontinuity at edge 245 and at the edge of the air-bridge 120.

Typically, numerical analysis is required to compute and analyze the diffraction pattern formed in FBAR 100 comprising piezoelectric layer 230, np layer 220, edge 245 and air-bridge 120. As described more fully below, improved FBAR 100 performance resulting from suppression of the diffraction pattern in np layer 220 occurs when the width of overlap 240 of top electrode 105 and np layer 220 are an integer multiple (1, 2, 3, . . . ) of quarter-wavelength ($\lambda/4$) of the lowest order propagating eigenmode in the np layer 220. In order to foster this diffractive effect, in certain embodiments, the width of overlap 240 of top electrode 105 and np layer 220 is selected to be an integer multiple (1, 2, 3, . . . ) of quarter-wavelength ($\lambda/4$) of the lowest order propagating eigenmode in np layer 220. Because a significant portion of the energy of propagating eigenmodes in np layer 220 is found in the first order propagating eigenmode, the largest amount of modal suppression can be achieved by fostering diffractive suppression of this mode in np layer 220. In certain embodiments the greatest parallel impedance (Rp) and the highest Q is attained by selecting the width of the overlap 240 of the top electrode 105 and the np layer 220 is selected to be an integer multiple (1, 2, 3, . . . ) of quarter-wavelength ($\lambda/4$) of the lowest order propagating eigenmode in the np layer 220.

Figure 3A:
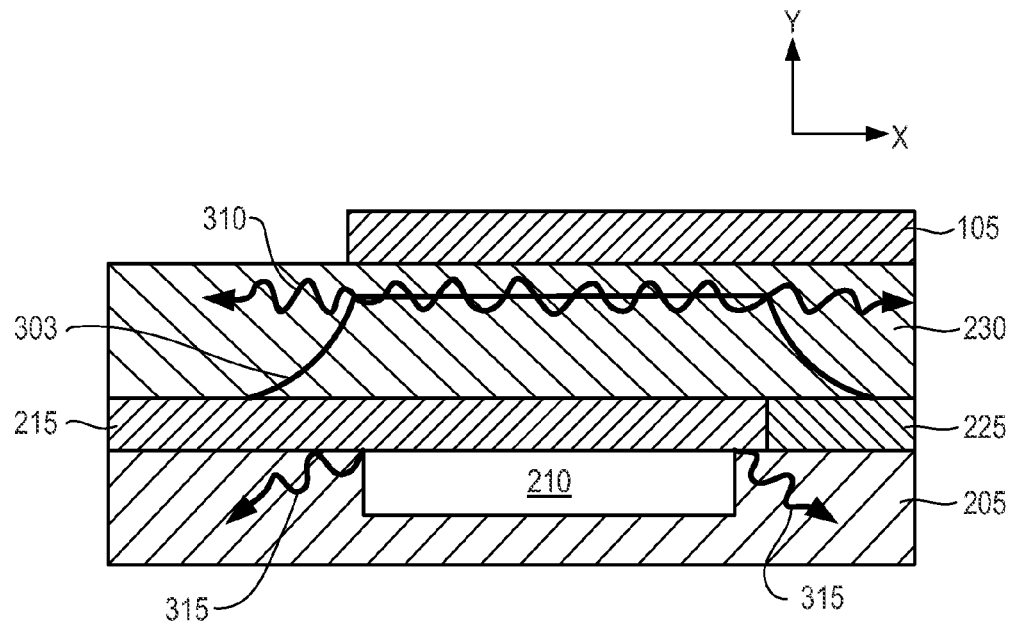
FIGS. 3A and 3B are cross-sectional views illustrating the use of a non-piezoelectric material to prevent loss of acoustic energy in the FBAR of FIG. 2.
Figure 3B:
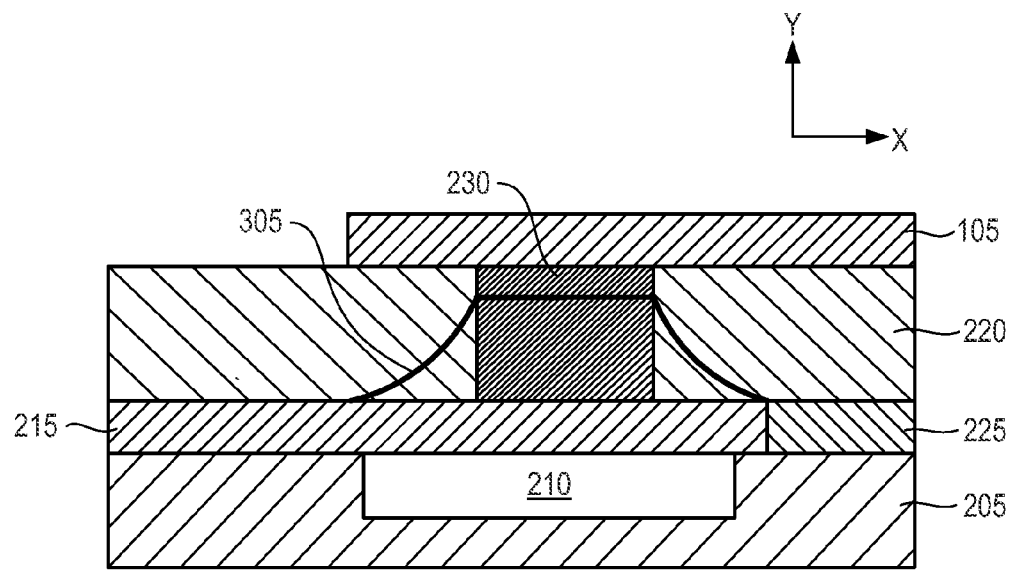

FIGS. 3A and 3B are cross-sectional views illustrating the use of an np material to prevent loss of acoustic energy in FBAR 100 of FIG. 2. For simplicity of illustration, FIGS. 3A and 3B show FBAR 100 without air-bridge 120. This is intended to illustrate the effects of the np material independent of air-bridge 120.

Referring to FIGS. 3A and 3B, a first curve 305 illustrates evanescent eigenmodes, and a second curve 310 illustrates propagating eigenmodes. The evanescent modes have a constant profile in active region 235, and they decay exponentially at the boundaries of active region 235. By contrast, the propagating eigenmodes have a spatially periodic profile both inside and outside of active region 235. Beyond the edge of top electrode 105 only a complex evanescent version of thickness extensional mode (electrically excited under top electrode 105) can exist. The complex evanescent mode is in general characterized by non-zero both real and imaginary parts of the propagating constant. However, there are other pure propagating modes, notably shear and flexural ones, than can exist in the region beyond top electrode 105.

The evanescent eigenmodes and the propagating eigenmodes both tend to scatter at impedance discontinuities in FBAR 100. For example, in FIGS. 3A and 3B, there are impedance discontinuities at a left boundary of top electrode 105 and a right boundary of cavity 210.

In the example of FIG. 3A, active region 235 extends all the way to the impedance discontinuities, so the evanescent eigenmodes tend to scatter at the discontinuities, as illustrated by two arrows labeled 315. This scattering can be reduced, however, by forming np layer 220 adjacent to piezoelectric layer 230, as illustrated in FIG. 3B.

In the example of FIG. 3B, the evanescent eigenmodes decay exponentially at interfaces between piezoelectric layer 230 and np layer 220. Consequently, these modes are substantially absent at the impedance discontinuities defined by the left boundary of top electrode 105 and the right boundary of cavity 210. As a result, the scattering shown of FIG. 3A is reduced in the example of FIG. 3B. Moreover, in an ideal case comparable to FIG. 3B, the diffraction pattern of the propagating mode is such that it is perfectly suppressed and so the curve 310 present in FIG. 3A is absent in FIG. 3B.

Figure 4A:
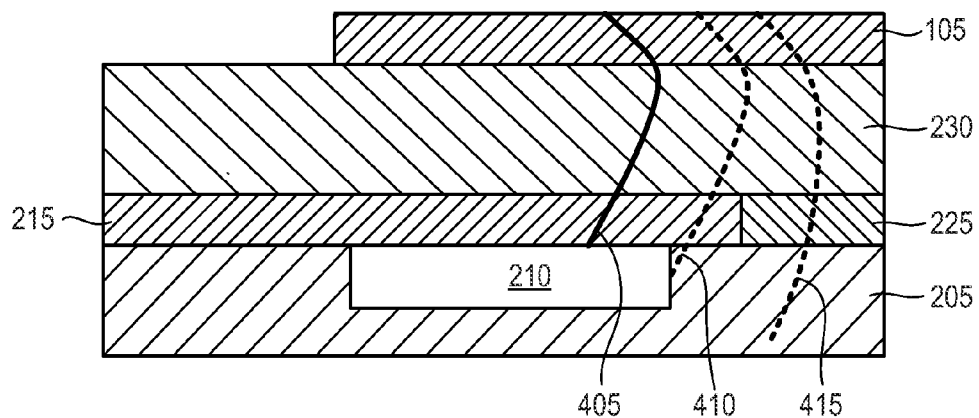
FIGS. 4A and 4B are cross-sectional views illustrating the use of an air-bridge to prevent loss of acoustic energy in the FBAR of FIG. 2.
Figure 4B:
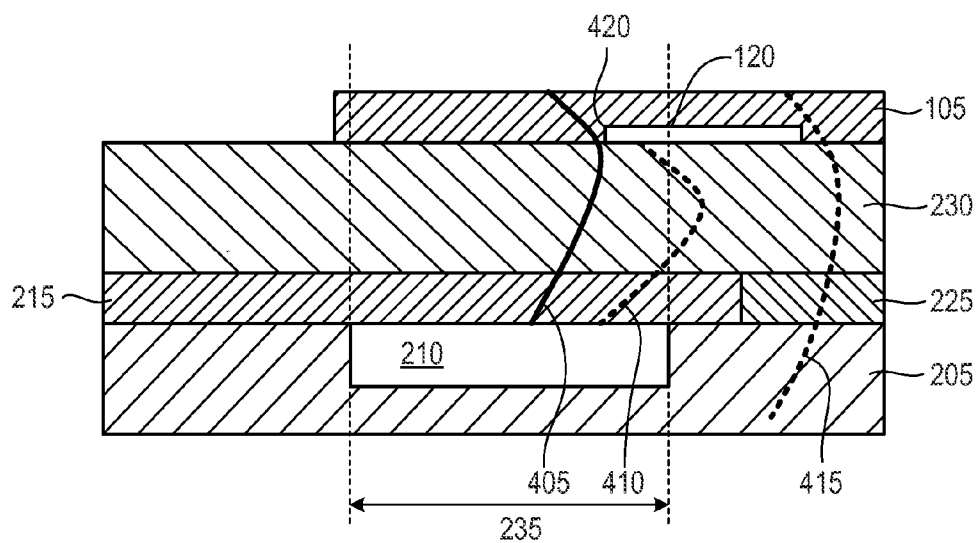

FIGS. 4A and 4B are cross-sectional views illustrating the use of an air-bridge to prevent loss of acoustic energy in the FBAR of FIG. 2. For simplicity of illustration, FIGS. 4A and 4B show FBAR 100 without np layer 220. This is intended to illustrate the effects of air-bridge 120 independent of np layer 220.

Referring to FIGS. 4A and 4B, an inner curve 405, a middle curve 410, and an outer curve 415 represent different eigenmodes of FBAR 100. More specifically, inner curve 405 represents eigenmodes that exist in an inner region of FBAR 100, middle curve 410 represents eigenmodes in a region including air-bridge 120, and outer curve 415 represents eigenmodes in an outer region of FBAR 100.

Referring to FIG. 4A, in the absence of air-bridge 120, inner curve 405, middle curve 410, and outer curve 415 have substantially the same shape, indicating relatively strong coupling between the eigenmodes of the inner region of FBAR 100, and the eigenmodes of the outer region of FBAR 100 along the connection side 115 shown in FIG. 1. This strong coupling allows propagating eigenmodes to readily escape active region 235, causing a loss of acoustic energy.

Referring to FIG. 4B, the presence of air-bridge 120 changes the stress distribution of the region including air-bridge 120. In particular, air-bridge 120 may lower the center of stress distribution in this region. This modifies the eigenmodes of the region encompassed by air-bridge 120, as illustrated by a modified shape of middle curve 410 in FIG. 4B. Middle curve 410 corresponds to a complex evanescent mode at FBAR's frequency of operation that decays exponentially in the direction away from an edge 420 of air-bridge 120. Meanwhile, the inner and outer regions of FBAR have substantially the same propagating eigenmodes in both FIGS. 4A and 4B, as illustrated by inner and outer curves 405 and 415. By changing the eigenmodes of FBAR 100 in this manner, air-bridge 120 decouples the eigenmodes of the inner region of FBAR 100 from the eigenmodes in the outer region of FBAR 100. Generally, an optimum width of air-bridge 120 depends on the reflection of the eigenmodes at edge 420, which is the boundary of active region 235 (also referred to herein as an FBAR region), and a decoupling region 260. Due to the smaller thickness of layers in the decoupling region 260 only complex evanescent modes for the thickness-extensional motion can exist at the operating frequency of the FBAR 100. These complex evanescent modes are characterized by a characteristic decay length and a specific propagation constant.

Air-bridge 120 should be wide enough to ensure suitable decay of complex evanescent waves excited at the boundary between the FBAR region and the decoupling region. Wide bridges tend to minimize tunneling of energy into the field region where propagating modes exist at the frequency of operation, as illustrated by outer curve 415. On the other hand, if air-bridge 120 is too wide, the electric field can reduce the effectiveness of the electromechanical coupling of the resonator and the reliability issues can arise. Both factors can limit the placement of similar FBARs (not shown) from being placed in close proximity, thus unnecessarily increasing the total area of a chip.

In practical situations, the propagating component of the complex evanescent wave can be used to find the optimum width of air-bridge 120. In general, where the width of air-bridge 120 is equal to an integer multiple of the quarter-wavelength of the complex evanescent wave, the reflectivity of the eigenmodes can be further increased, which can be manifested by Rp and Q attaining maximum values. Typically, depending on the details of the excitation mechanism, other propagating modes of decoupling region 260, such as shear modes and flexural modes, can impact Rp and Q. The width of air-bridge 120 can be modified in view of these other propogating modes. Such optimum width of air-bridge 120 can be determined experimentally.

Figure 5:
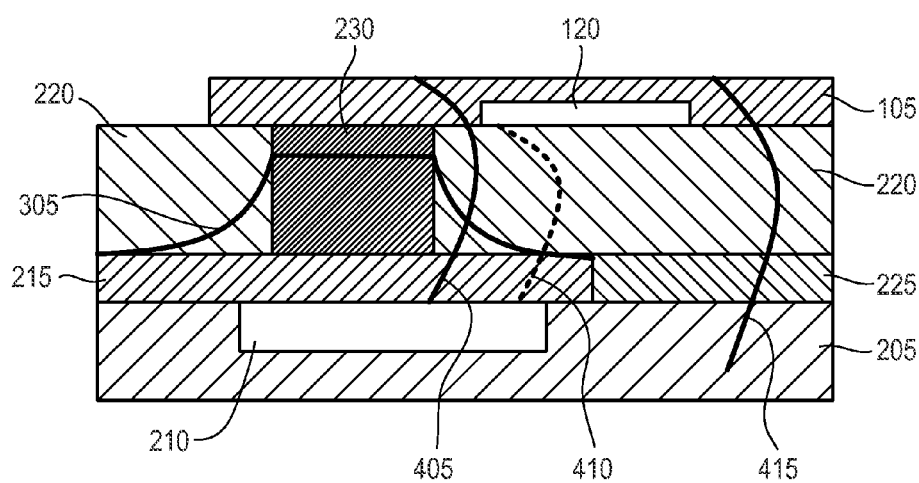
FIG. 5 is a cross-sectional view of the FBAR of FIG. 2, with illustrations of contained acoustic energy.

FIG. 5 is a cross-sectional view of the FBAR of FIG. 2, with illustrations of contained acoustic energy. As illustrated by FIG. 5, the combination of np layer 220 and air-bridge 120 reduces multiple forms of energy loss in FBAR 100. In particular, it reduces energy loss due to scattering of evanescent eigenmodes at impedance discontinuities, as illustrated by the first curve 305, and it also reduces energy loss due to propagating eigenmodes, as illustrated by inner, middle and outer curves 405, 410, and 415, respectively.

Figure 6A:
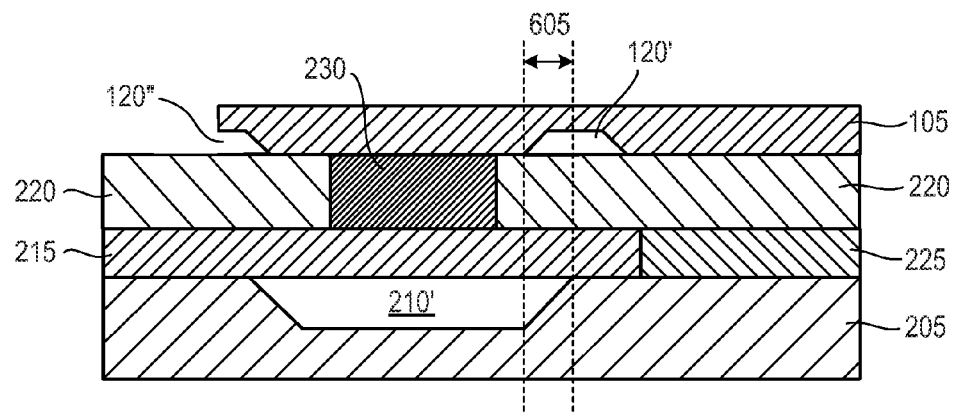
FIGS. 6A through 6C are cross-sectional views of different variations of the FBAR of FIG. 2 in accordance with representative embodiments.
Figure 6B:
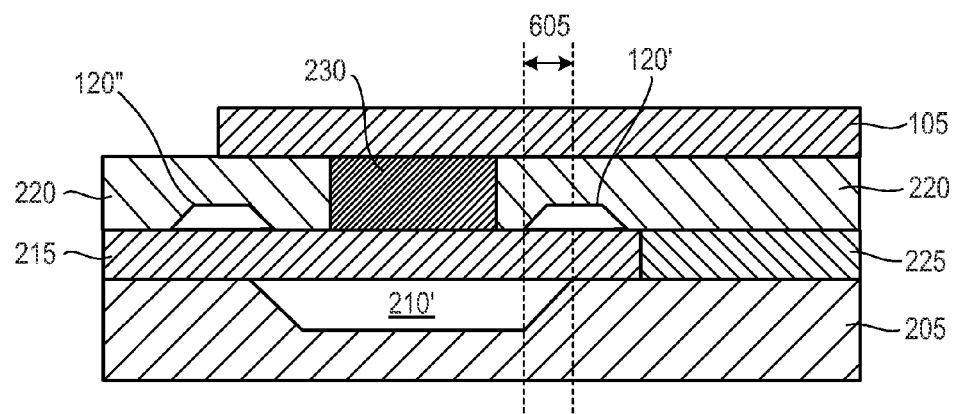
Figure 6C:
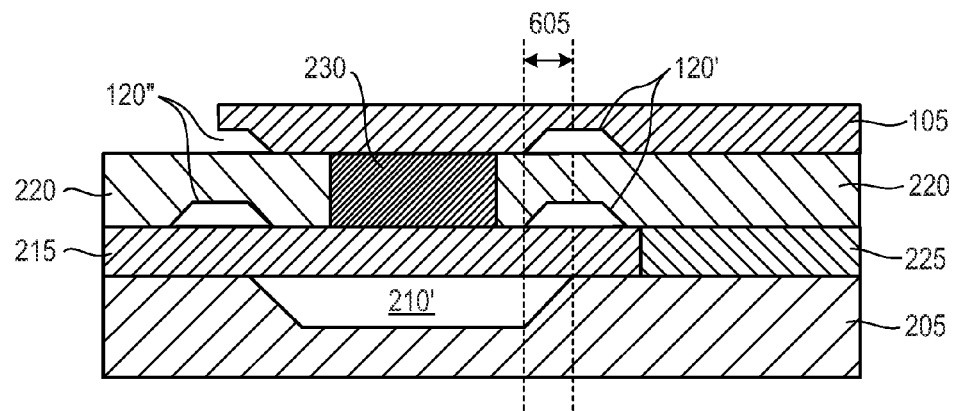

FIGS. 6A through 6C are cross-sectional views of different variations of the FBAR of FIG. 2 in accordance with representative embodiments. These variations are intended to illustrate that the geometry and positioning of various features of FBAR 100 can be modified in various ways to achieve different design objectives.

In the variation shown in FIG. 6A, air-bridge 120 is replaced by an air-bridge 120' having a trapezoidal shape, and an additional bridge structure 120" is formed below top electrode 105. In addition, cavity 210 is replaced by a cavity 210'. The slanting walls of cavity 210' reflect more closely the shape actually formed during the processing. The slanting walls of air-bridge 120' can be beneficial to the quality of layers formed over these features. Air-bridge 120' can have dimensions and overlap properties similar to those discussed above in relation to FIG. 2. The additional bridge structure 120" has the shape of approximately one-half of air-bridge 120' and it forms a wing-type shape (See above-referenced U.S. patent application Ser. No. 12/626,035, to Choy, et al.) in top electrode 105. Piezoelectric layer 230 is centered between air-bridge 120' and additional bridge structure 120".

In the variation shown in FIG. 6B, air-bridge 120' and additional bridge structure 120" are both repositioned so that they are located below np layer 220. In this configuration, the dimensions and overlap properties of air-bridge 120' can be similar to those in FIG. 6A. In addition, piezoelectric layer 230 is centered between air-bridge 120' and additional bridge structure 120".

In the variation shown in FIG. 6C, two air-bridges 120' are formed above and below np layer 220 on a right side of piezoelectric layer 230, and two additional bridge structures 120" are formed above and below np layer 220 on the right side of piezoelectric layer 230. The use of multiple air-bridges can further decouple the propagating eigenmodes of an active region from an external region. In addition, piezoelectric layer 230 is centered between air-bridges 120' and additional bridge structures 120".

Figure 7:
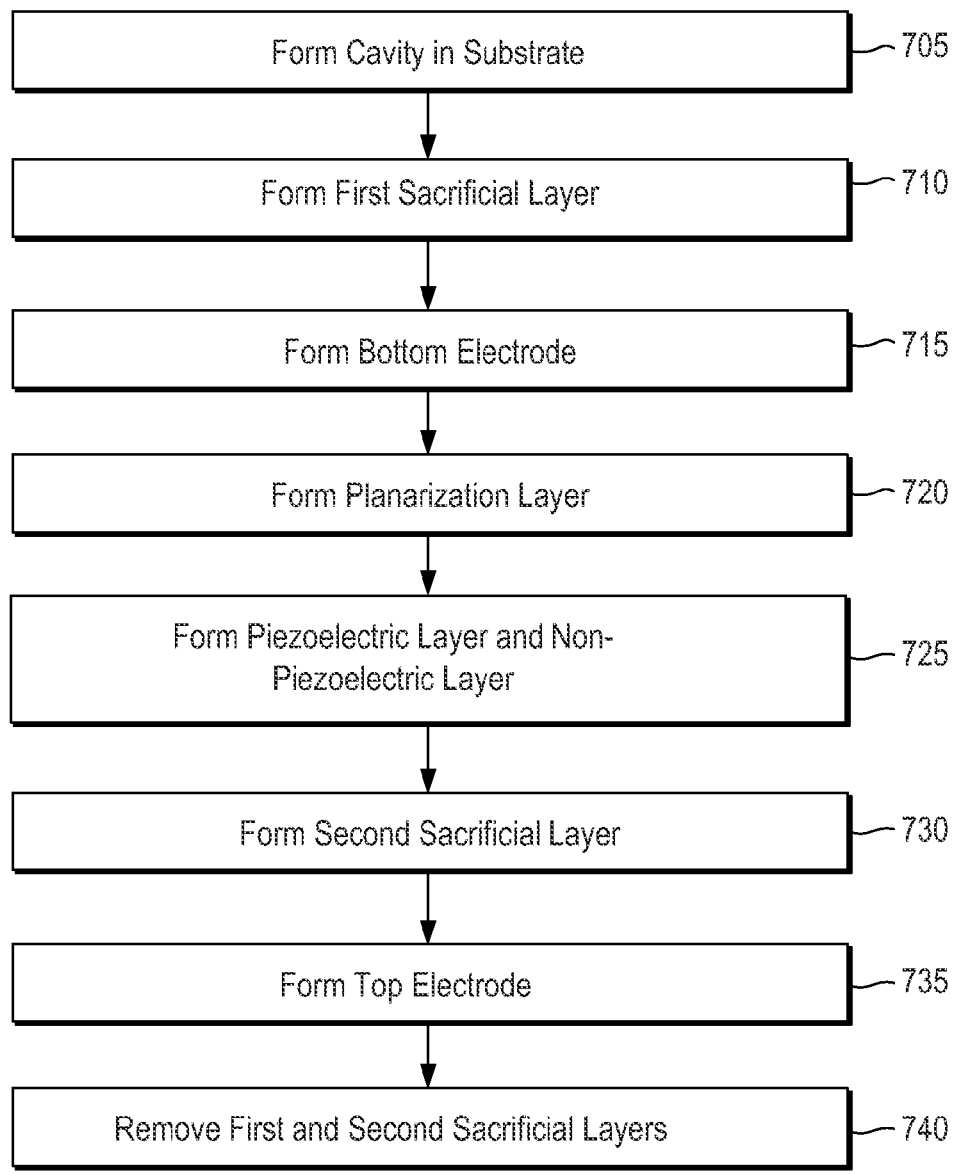
FIG. 7 is a flowchart illustrating a method of fabricating an FBAR in accordance with a representative embodiment.

FIG. 7 is a flowchart illustrating a method of forming an FBAR in accordance with a representative embodiment. For convenience of explanation, the method of FIG. 7 will be described with reference to FBAR 100 of FIG. 2. However, the method is not limited to forming an FBAR with the configuration of FIG. 2. In the description that follows, example method steps are indicated by parentheses.

Referring to FIG. 7, the method begins by etching substrate 205 to form cavity 210 (705). In a typical example, substrate 205 comprises silicon, and cavity 210 is formed by conventional etching technologies.

Next, a sacrificial layer is formed in cavity 210 (710). The sacrificial layer is subsequently removed to form an air gap in cavity 210. The air gap can act as an acoustic reflector to prevent acoustic energy from being absorbed by substrate 205. As an alternative to cavity 210, another type of acoustic reflector can be formed in or on substrate 205, such as a distributed Bragg reflector.

After the sacrificial layer is formed in cavity 210, bottom electrode 215 is formed over substrate 205 (715). In addition, planarization layer 225 is also formed over substrate 205 (720).

After bottom electrode 215 and planarization layer 225 are formed, piezoelectric layer 230 and np layer 220 are formed over bottom electrode 215 and planarization layer 225 (725). The formation of piezoelectric layer 230 and np layer 220 can be accomplished, for example, by a method illustrated in FIG. 8 or FIG. 9, as described below.

After piezoelectric layer 230 and np layer 220 are formed, a sacrificial layer is deposited on np layer 220 to define air-bridge 120 (730). Thereafter, top electrode 105 is formed over piezoelectric layer 230, np layer 220, and the sacrificial layer defining air-bridge 120 (735). Finally, the sacrificial layer of air-bridge 120 and the sacrificial layer of cavity 210 are removed to complete FBAR 100 (740).

Figure 8:
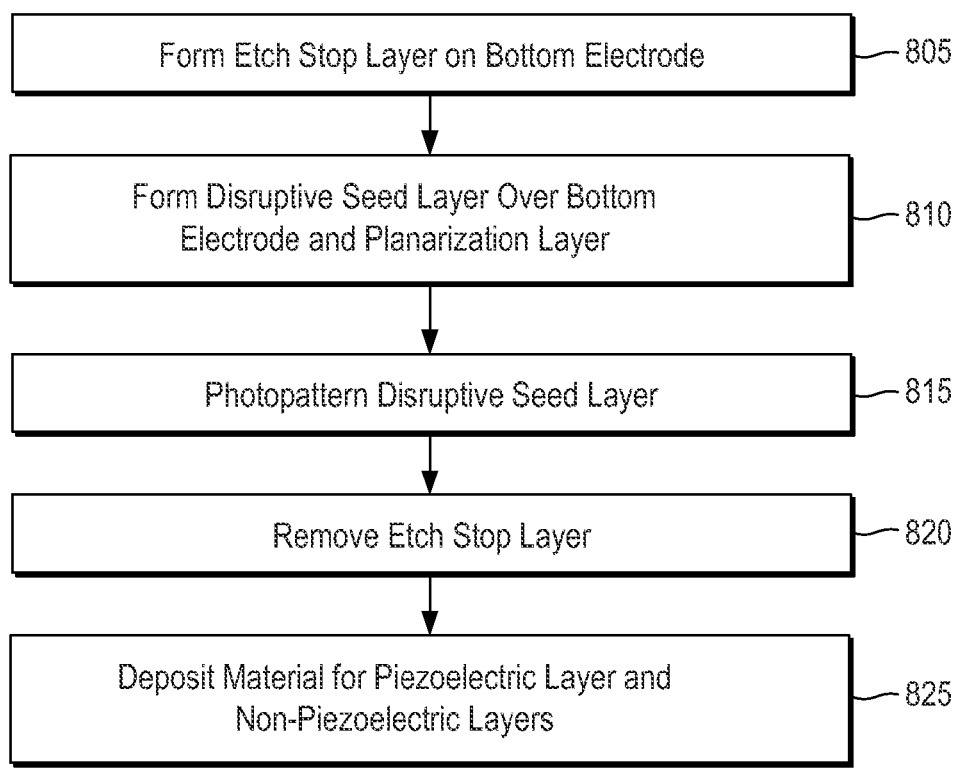
FIG. 8 is a flowchart illustrating a method of forming a piezoelectric layer and a non-piezoelectric layer on an electrode in accordance with a representative embodiment.

FIG. 8 is a flowchart illustrating a method of forming a piezoelectric layer and an np layer on an electrode in accordance with a representative embodiment. The method of FIG. 8 can be performed in step 725 of FIG. 7, for example. For convenience of explanation, the method of FIG. 8 will be described with reference to FBAR 100 of FIG. 2. However, the method is not limited to forming an FBAR with the configuration of FIG. 2.

Referring to FIG. 8, the method begins by forming an etch stop layer (e.g., AlN, not shown) over bottom electrode 215 to protect it from being etched in subsequent processes (805). Thereafter, a disruptive seed layer (not shown) is formed over bottom electrode 215 and planarization layer 225 (810). For AlN, the disruptive seed layer can be an oxide (e.g., carbon doped oxide (CDO) or silicon dioxide $SiO_2$) or silicon carbide (SiC). The disruptive seed layer can be relatively thin with a thickness range between approximately 50 Å and approximately 500 Å. As described below, the disruptive seed layer fosters fabrication of np layer 220 comprising amorphous or polycrystalline material that exhibits little or no piezoelectric effects because of crystal growth in a variety of directions. For other piezoelectric materials (e.g. ZnO) removal of the seed layer, which is typically provided to improve the quality of subsequently grown piezoelectric material, may be required to foster the disoriented growth.

Next, the disruptive seed layer is photo-patterned and removed except in regions above bottom electrode 215 where np layer 220 is desirably grown (815). Next, exposed portions of the etch stop layer are removed by a known method (820).

Thereafter, a material useful for piezoelectric layer 230 is grown over the exposed bottom electrode 215 and the disruptive seed layer (825). In regions over the first electrode, the growth results in highly textured c-axis piezoelectric material such as AlN or ZnO. However, in regions above the disruptive seed layer, material of the same substance as piezoelectric layer 230 is formed, but the crystal growth is purposefully disoriented and an amorphous or polycrystalline layer forms the np layer 220.

Figure 9:
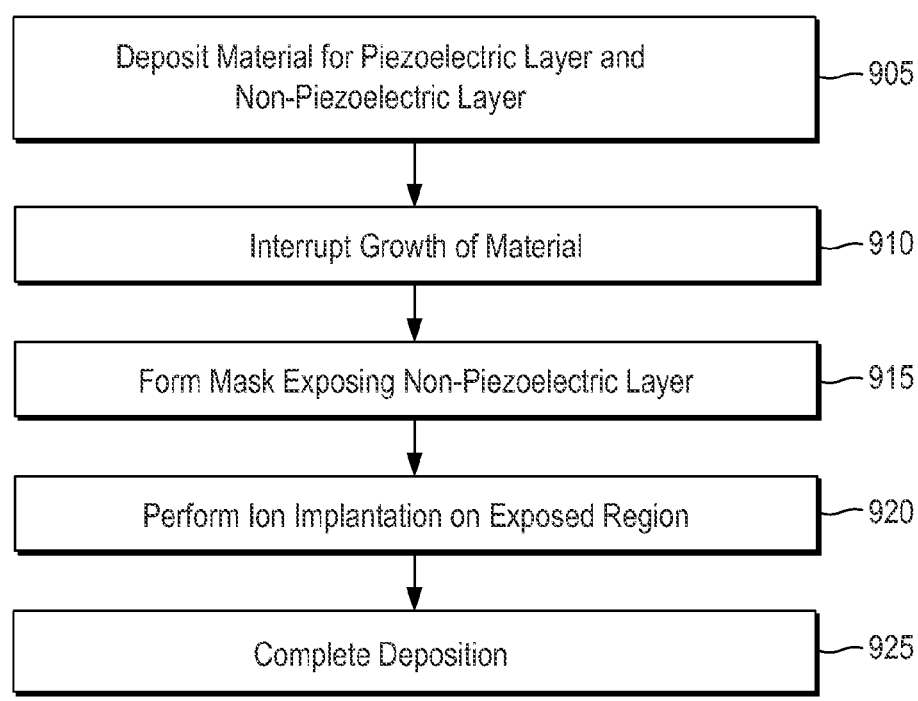
FIG. 9 is a flowchart illustrating another method of forming a piezoelectric layer and a non-piezoelectric layer on an electrode in accordance with a representative embodiment.

FIG. 9 is a flowchart illustrating another method of forming a piezoelectric layer and an np layer on an electrode in accordance with a representative embodiment. Like the method of FIG. 8, the method of FIG. 9 can also be performed in step 725 of FIG. 7, for example. For convenience of explanation, the method of FIG. 9 will be described with reference to FBAR 100 of FIG. 2. However, this method is not limited to forming an FBAR with the configuration of FIG. 2.

Referring to FIG. 9, after bottom electrode 215 is formed, fabrication of highly textured c-axis piezoelectric material (e.g., AlN or ZnO) is commenced (905). After forming an initial piezoelectric layer having a thickness being a fraction of the final thickness of np layer 220, the growth is interrupted (910) and a mask is formed over the area of the piezoelectric layer grown thus far, except where it is desired to grow np layer 220 (915).

The initial layer thickness is typically selected to be in a range of 20% to 80% of the final thickness of np layer 220. Notably, if the initial layer is too thin, the layer subsequently grown may have piezoelectric properties, which is not desired of np layer 220. By contrast, if the initial layer is too thick, the piezoelectric properties of already grown material may dominate the properties of np layer 220. As such the optimal initial layer thickness is determined experimentally.

Next, an ion implantation step is carried out to reduce or destroy the crystallinity of the material in the unmasked region (i.e., where np layer 220 is to be formed) (920). In various embodiments, the ions used for this ion implantation step can be oxygen ions, argon ions, boron ions, phosphorous ions or hydrogen ions. The ion implantation can be accomplished by known methods, and it can be carried out with a single energy and dose or multiple energies and doses. For example, the energy of the ion implantation can be in the range of approximately 150 keV to approximately 450 keV, and the doses are between approximately $1 \times 10^{14}/cm^2$ to approximately $1 \times 10^{16}/cm^2$.

After the ion implantation is completed, the mask is removed, and deposition of the material continues until a desired thickness is achieved (925). In the masked regions, piezoelectric layer 230 is formed, and in unmasked regions, np layer 220 is formed. Notably, because a disruptive seed layer is not provided, piezoelectric layer 230 and the np layer 220 have substantially the same thickness, and their upper surfaces (over which the top electrode 105 is formed) are substantially coplanar.

In the above described embodiments, np layer 220 can have a thickness that is substantially identical to that of piezoelectric layer 230, or slightly greater in thickness because of the added disruptive seed layer. As noted above, np layer 220 exhibits little or no piezoelectric effects. In certain embodiments, np layer 220 has a piezoelectric coupling coefficient ($e_{33np}$) that is less than the piezoelectric coupling coefficient ($e_{33p}$) of the piezoelectric layer. Illustratively, $e_{33np}$ is in the range of approximately 0.01 $e_{33p}$ to approximately 0.8 $e_{33p}$. As described above, a comparatively low $e_{33np}$ ensures beneficial decay of the evanescent eigenmode in np layer 220, improved propagating eigenmode confinement in active region 235, and improved performance (e.g., Q-factor) of FBAR 100.

Figure 10:
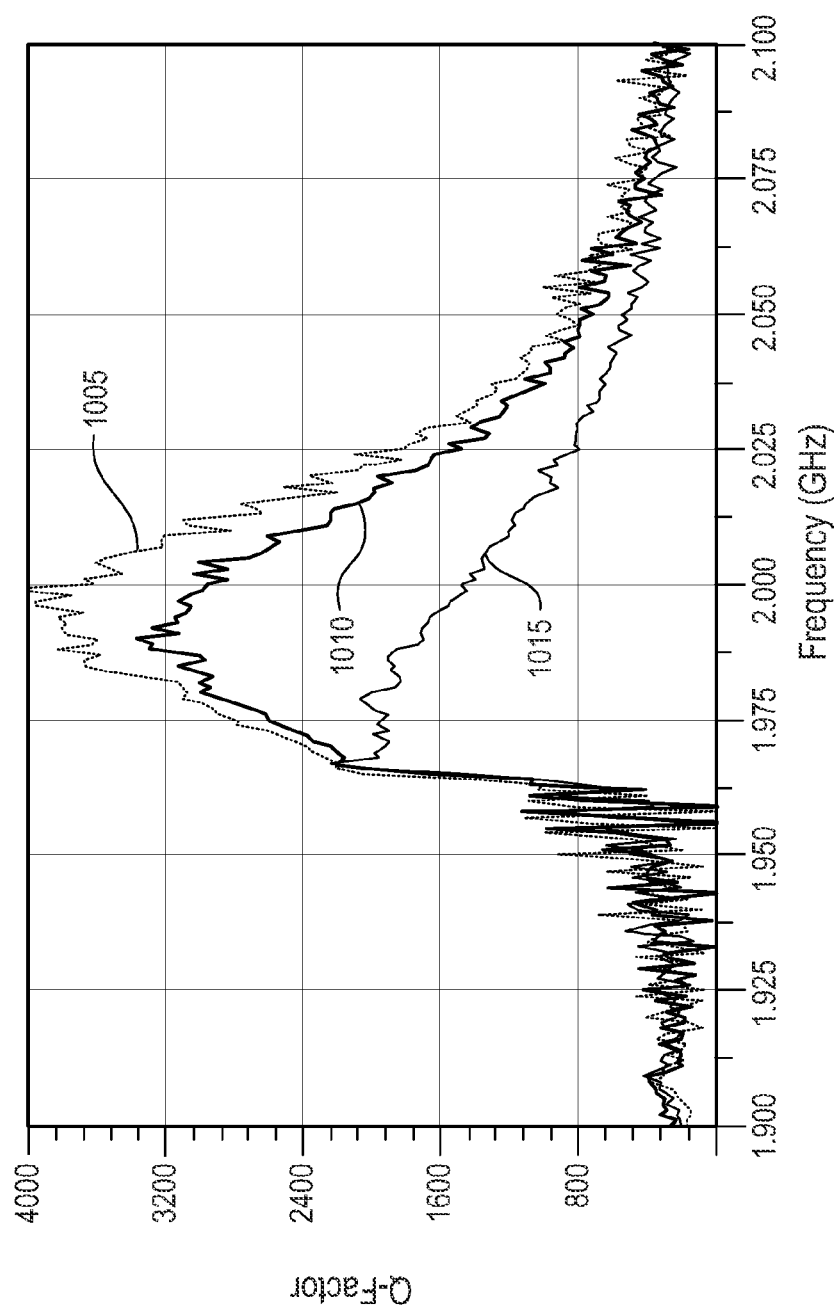
FIG. 10 is a graph illustrating the quality (Q) factor of an FBAR as a function of frequency in accordance with a representative embodiment.

FIG. 10 is a graph illustrating the measured Q-factor of an FBAR such as that illustrated in FIG. 2 (curve 1005). For comparison purposes, FIG. 10 also shows Q-factors of the FBAR without the air-bridge but with np layer 220 (curve 1010), and without the air-bridge and the non-piezoelectric layer (curve 1015). As indicated by curve 1005, the FBAR including the air-bridge and np layer has a significantly improved Q-factor in a frequency range of interest around 2 GHz.

As indicated by the foregoing, in accordance with illustrative embodiments, BAW resonator structures comprising a non-piezoelectric layer and an air-bridge and their methods of fabrication are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the scope of the appended claims.

The invention claimed is:

1. A bulk acoustic wave (BAW) resonator, comprising:
a first electrode formed on a substrate;
a piezoelectric layer formed on the first electrode;
a second electrode formed on the first piezoelectric layer;
a non-piezoelectric layer formed on the first electrode and adjacent to the piezoelectric layer; and
a bridge formed between the non-piezoelectric layer and the first or second electrode.

2. The BAW resonator of claim 1, wherein the bridge is an air-bridge.

3. The RAW resonator of claim 1, wherein the bridge comprises a cavity Idled with a dielectric material or a metal.

4. The BAW resonator of claim 1, wherein the non-piezoelectric layer is polycrystalline.

5. The BAW resonator of claim 1, wherein the piezoelectric layer comprises a material, and the non-piezoelectric layer is a non-crystalline form of the material.

6. The RAW resonator of claim 5, wherein the material is aluminum nitride.

7. The RAW resonator of claim 1, further comprising an acoustic reflector disposed beneath the first electrode.

8. The BAW resonator of claim 7, wherein the acoustic reflector comprises a cavity, and the bridge overlaps the cavity in a lateral direction of the BAW resonator.

9. The BAW resonator of claim 1, wherein the piezoelectric layer has a piezoelectric coupling coefficient (e33) and the non-piezoelectric layer has a piezoelectric coupling coefficient that is less or equal to 80% of the first piezoelectric coupling coefficient.

10. The BAW resonator of claim 1, wherein the bridge is formed on multiple sides of a BAW resonator structure formed in an apodized pentagon shape.

11. The BAW resonator of claim 1, wherein the bridge has a trapezoidal shape.

* * * * *